United States Patent
Potkonjak et al.

(10) Patent No.: US 6,948,114 B2
(45) Date of Patent: Sep. 20, 2005

(54) MULTI-RESOLUTION VITERBI DECODING TECHNIQUE

(75) Inventors: Miodrag Potkonjak, Fremont, CA (US); Seapahn Megerian, West Hills, CA (US); Advait Mogre, Sunnyvale, CA (US); Dusan Petranovic, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 559 days.

(21) Appl. No.: 10/132,360

(22) Filed: Apr. 25, 2002

(65) Prior Publication Data

US 2003/0204809 A1 Oct. 30, 2003

(51) Int. Cl.$^7$ .............................................. H03M 13/03
(52) U.S. Cl. ...................................... 714/792; 714/796
(58) Field of Search ................................ 714/792, 796, 714/795, 794, 752, 786, 751; 375/296, 241; 348/726

(56) References Cited

U.S. PATENT DOCUMENTS

| | | | | |
|---|---|---|---|---|
| 5,742,621 A | * | 4/1998 | Amon et al. | 714/792 |
| 6,438,181 B1 | * | 8/2002 | Setlur et al. | 375/341 |
| 6,680,986 B1 | * | 1/2004 | Hemmati | 375/341 |
| 6,690,739 B1 | * | 2/2004 | Mui | 375/265 |
| 6,734,920 B2 | * | 5/2004 | Ghosh et al. | 348/614 |
| 2001/0036232 A1 | * | 11/2001 | Betts | 375/265 |

OTHER PUBLICATIONS

"Short Convolutional Codes With Maximal Free Distance for Rates ½, ⅓, and ¼", By Knud J. Larsen, IEEE Transactions on Information Theory, vol. 17–19, May. 1973, pp. 371–372.

"Error Bounds for Convolutional Codes and an Asymptotically Optimum Decoding Algorithm", By Andrew J. Viterbi, IEEE Transactions on Information Theory, vol. IT–13, Apr. 1967, pp. 260–269.

AHA Application Note—"Soft Decision Thresholds and Effects on Viterbi Performance", Jul. 1995, p. 1–8.

"A Tutorial on Convolutional Coding with Viterbi Decoding", By Chip Fleming of Spectrum Applications, Updated Nov. 27, 2001 31 pages.

* cited by examiner

Primary Examiner—Guy Lamarre
Assistant Examiner—Mujtaba K. Chaudry
(74) Attorney, Agent, or Firm—Christopher P. Maiorana P.C.

(57) ABSTRACT

A method for decoding an encoded signal. A first step generates a plurality of first precision state metrics for a decoder trellis in response to a plurality of first precision branch metrics. A second step generates a plurality of second precision state metrics for a selected subset of the first precision state metrics in response to a plurality of second precision branch metrics. A third step replaces the selected subset of first precision state metrics with the second precision state metrics. A fourth step stores the first precision state metrics and the second precision state metrics.

20 Claims, 10 Drawing Sheets

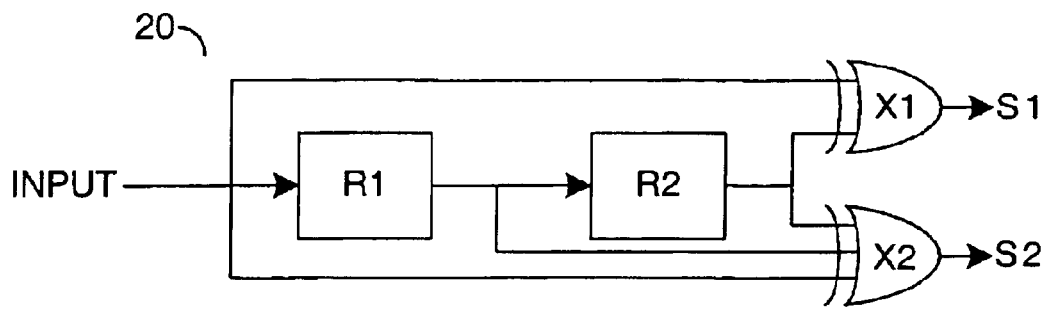
(CONVENTIONAL)
FIG. 1
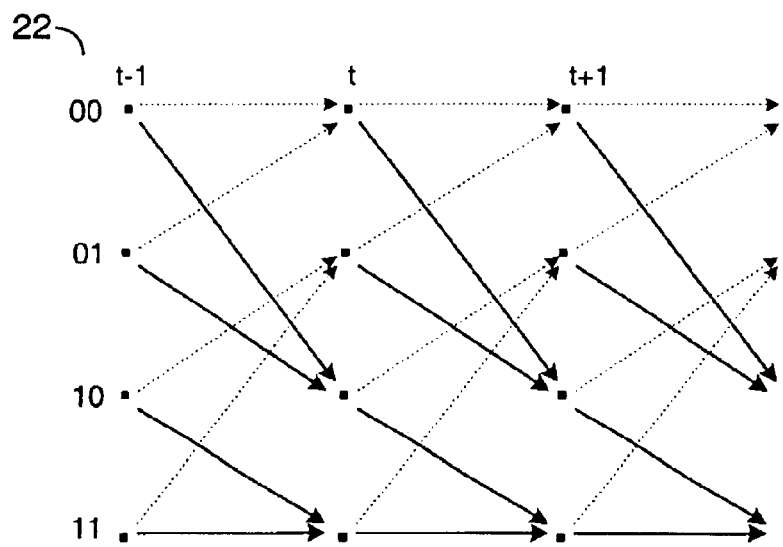
(CONVENTIONAL)
FIG. 2

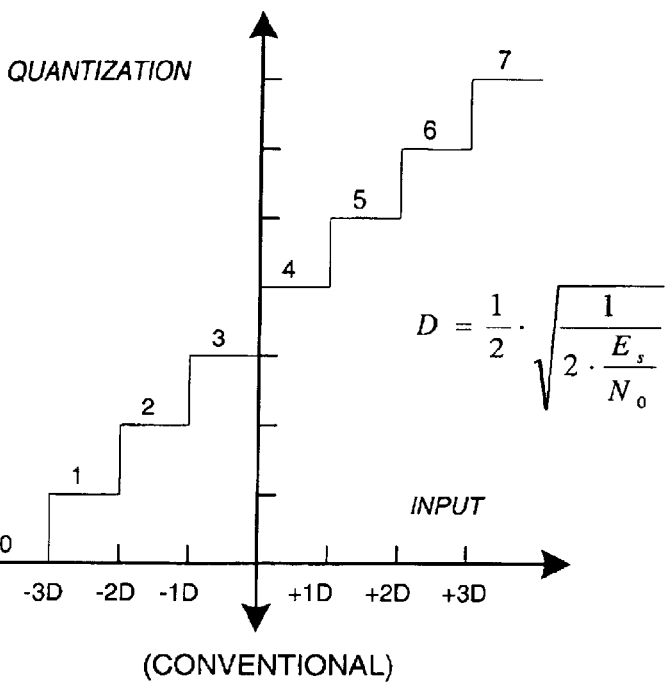
(CONVENTIONAL)
FIG. 3

MULTI-RESOLUTION VITERBI DECODING TECHNIQUE

FIELD OF THE INVENTION

The present invention relates to a method and/or architecture for Viterbi decoding generally and, more particularly, to a method and apparatus for multi-resolution trellis decoding.

BACKGROUND OF THE INVENTION

In most modern communication systems, channel encoding is used to add error detection and correction capabilities and provide a systematic way to translate logical bits of information to analog channel symbols used in transmission. Convolutional encoding and block encoding are the two major forms of channel coding used today. Block coding processes big chunks or blocks of data, with the current block encoding done independently of previous blocks. Convolutional encoding is well suited for processing continuous data streams with the current output depending not only on the current input, but also a certain number of consecutive previous inputs. Since convolutional forward error correction (FEC) works well with data streams affected by the atmospheric and environmental noise (i.e., Additive White Gaussian Noise) encountered in satellite and cable communications, the convolutional encoders have found widespread use in many advanced communication systems.

Convolutional codes are defined using two parameters, a code rate (k/n) and a constraint length (K). The code rate of the convolutional encoder is calculated as the ratio k/n where k is the number of input data bits and n is the number of channel symbols output by the encoder. The constraint length K is directly related to the number of registers in the encoder. The (shift) registers hold the previous data input values that are systematically convolved with the incoming data bits. A resulting redundancy of information in the final transmission stream is the key factor enabling for the error correction capabilities that are useful when dealing with transmission errors.

Referring to FIG. 1, an example of a conventional rate convolutional encoder 20 with K=3 (four states) is shown. The conventional encoder generates two channel symbols (i.e., S1 and S2) as each incoming data bit is shifted into register flip-flops R1 and then R2. Although the rate encoding effectively reduces the channel bandwidth by a factor of two, the power savings gained due to the increased reliability of the channel offset the negative effects of the reduced bandwidth and overall, the technique improves the efficiency of the channel.

Viterbi decoding and sequential decoding are the two main types of algorithms used with convolutional codes. Although sequential decoding performs very well with long-constraint-based convolutional codes, sequential decoding has a variable decoding time and is less suited for hardware implementations. On the other hand, the Viterbi decoding process has fixed decoding times and is well suited for hardware implementations. An exponentially increasing computation requirements as a function of the constraint length K limits current implementations of the Viterbi decoder to about a constraint length K equal to nine.

Viterbi decoding, also known as maximum-likelihood decoding, comprises the two main tasks of updating a trellis and trace-back. The trellis used in Viterbi decoding is essentially the convolutional encoder state transition diagram with an extra time dimension. The trace-back is used to determine the most likely bit sequence received by the encoder 20.

Referring to FIG. 2, an example of a conventional trellis diagram 22 for a four-state (K=3) Viterbi decoder is shown. The four possible convolutional encoder states are depicted as four rows (i.e., 00, 01, 10 and 11) in the trellis diagram 22. Solid arrows represent branch transitions based on logical "1" inputs to the encoder 20 and the dashed arrows represent branch transitions based on logical "0" inputs to the encoder 20. The encoder 20 produces two channel symbols S1 and S2 associated with each branch in the trellis 22.

After each time instance t, elements in the column t contain the accumulated error metric for each encoder state, up to and including time t. Every time a pair of channel symbols S1 and S2 is received, the process updates the trellis by computing a branch metric associated with each possible transition. In hard decision decoding, the branch metric is most often defined to be the Hamming distance between the channel symbols S1 and S2 and the symbols 00, 01, 10 and 11 associated with each branch. For the hard decision rate decoding (two channel symbols per branch), the possible branch metric values are 0, 1, and 2, depending on the number of mismatched bits. The total error associated with taking each branch is a sum of the branch metric and the accumulated error value of a state metric from which the branch initiates. Since there are two possible branch transitions into each state, the smaller of the two accumulated error metrics is used to replace the current state metric value of each state.

The state with the lowest accumulated error metric is determined as the candidate for trace-back. A path created by taking each branch leading to the candidate state is traced back for a predefined number of steps. An initial branch in the trace-back path indicates the most likely transition in the convolutional encoder 20 and is therefore used to obtain the actual encoded bit value in the original data stream.

To make the decoder work, received channel symbols S1 and S2 must be quantized. In hard decision decoding, channel symbols S1 and S2 can each be either a logical "0" or a logical "1". Hard decision Viterbi decoders can be extremely fast due to the small number of bits involved in the calculations. However, tremendous bit error rates (BER) improvements have been achieved by increasing the number of bits (resolution) used in quantizing the channel symbols S1 and S2.

Referring to FIG. 3, an example of a conventional uniform quantizer function 24 using 3-bits (eight levels) to represent a symbol received on the channel is shown. An energy per symbol to noise density ratio (i.e., Es/No) is used to calculate a decision level (i.e., D). The decision level D is then used to determine the branch metrics to a higher precision than just 0, 1 or 2. The higher precision branch metrics in turn create higher precision state metrics. The benefits of soft decision over hard decision decoding are offset by the cost of significantly bigger and slower hardware.

SUMMARY OF THE INVENTION

The present invention concerns a method for decoding an encoded signal. The method generally comprises the steps of (A) generating a plurality of first precision state metrics for a decoder trellis in response to a plurality of first precision branch metrics, (B) generating a plurality of second precision state metrics for a selected subset of the first precision state metrics in response to a plurality of second precision branch metrics, (C) replacing the selected subset of first precision state metrics with the second precision state metrics, and (D) storing the first precision state metrics and the second precision state metrics.

The objects, features and advantages of the present invention include providing a method of convolution decoding that may provide for (i) high performance, (ii) minimal delay overheads, (iii) minimal die area to implement, (iv) low cost, (v) a variety of bit error rates and/or (vi) a variety of throughput rates.

BRIEF DESCRIPTION OF THE DRAWINGS

These and other objects, features and advantages of the present invention will be apparent from the following detailed description and the appended claims and drawings in which:

FIG. 1 is a block diagram of a conventional convolution encoder;

FIG. 2 is a diagram of a conventional Viterbi trellis;

FIG. 3 is a diagram of a conventional uniform quantizer function;

DETAILED DESCRIPTION OF THE PREFERRED EMBODIMENTS

Figure 4:
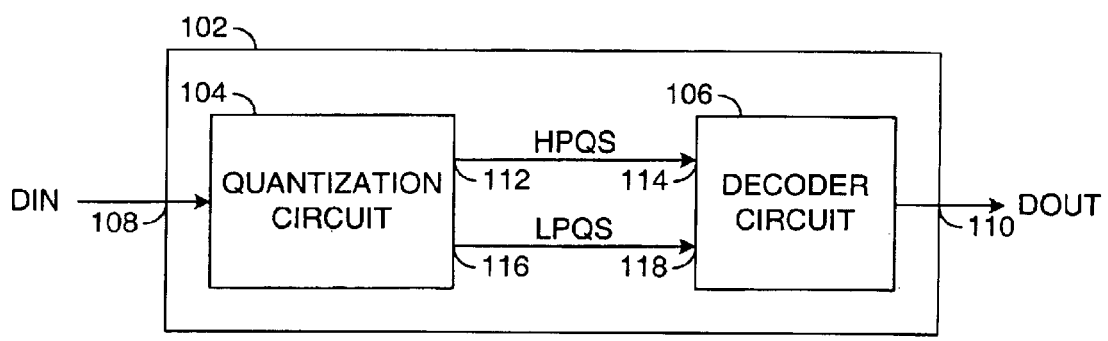
FIG. 4 is a block diagram of a preferred embodiment of the present invention.

Referring to FIG. 4, a block diagram of an apparatus 102 is shown in accordance with a preferred embodiment of the present invention. The apparatus 102 may be implemented as a Viterbi decoder. In particular, the apparatus 102 may be implemented as a multi-resolution Viterbi decoder. The multi-resolution Viterbi decoder 102 generally comprises a quantization circuit 104 and a decoder circuit 106.

An input 108 may be provided in the multi-resolution Viterbi decoder 102 to receive a signal (e.g., DIN). An output 110 of the multi-resolution Viterbi decoder 102 may present another signal (e.g., DOUT). The quantization circuit 104 may have an output 112 to present a signal (e.g., HPQS) to an input 114 of the decoder circuit 106. The quantization circuit 104 may have another output 116 to present a signal (e.g., LPQS) to an input 118 of the decoder circuit 106.

The signal DIN may be implemented as a channel signal.

The channel signal DIN generally comprises multiple symbols, usually arranged in sets of two or more. Each set of symbols may represent one or more bits of encoded information. Each set of symbols may be time multiplexed, frequency multiplexed, phase multiplexed, spatially multiplexed or the like through a channel (not shown).

The signal DOUT may be implemented as a data output signal. The signal DOUT may be a most likely sequence of bits represented by the encoded information within the signal DIN. The signal DOUT is generally a sequence of logical ones and logical zeros.

The signals LPQS (low precision quantized symbol) and HPQS (high precision quantized signal) may be implemented as quantized symbols. The signal HPQS may be soft quantized to two or more bits of precision. The signal LPQS may be hard quantized to a one-bit precision or soft quantized to two or more bits of precision. In general, the signal HPQS may have a higher precision than the signal LPQS.

Figure 5:
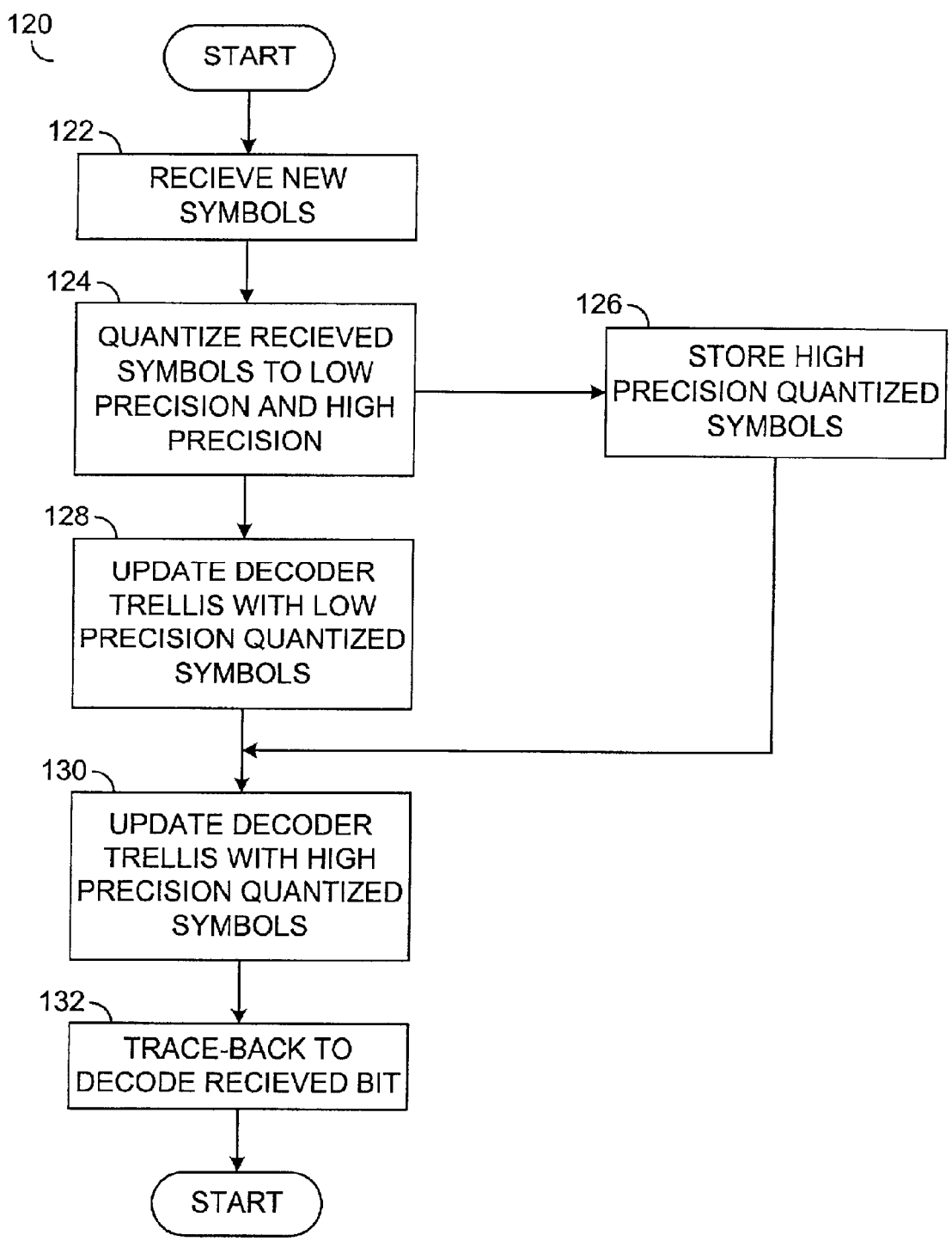
FIG. 5 is a flow diagram of a method for decoding.

Referring to FIG. 5, a flow diagram of a method 120 for decoding is shown in accordance with a preferred embodiment of the present invention. The method 100 may be implemented as a multi-resolution Viterbi decoding process for use in the multi-resolution Viterbi decoder 102. Effective tradeoffs between implementation area, speed and performance may be allowed for by the method 120. The method 120 may combine hard and soft decision decoding techniques that may reduce hardware implemented for decoding, while at the same time preserve good performance.

The method 120 is generally based on an observation that at any given time, only a relatively small number of the trellis states are likely candidates for trace-back while others with larger accumulated errors are less likely to be useful. Therefore, updates of a decoder trellis may initially use fewer bits. After each step, branch metrics may be recalculated for several "better" paths (e.g., paths with smaller accumulated errors) using higher precision.

A start of the method 120 generally involves a reception of a set of new symbols in the channel signal DIN (e.g., block 122). The received symbols by used by the quantization circuit 104 to generate the low precision signal LPQS and the high precision signal HPQS (e.g., block 124). The high precision signal HPQS may be stored by the decoder circuit 106 for later use (e.g., block 126).

The decoder circuit 106 may use the low precision signal LPQS to update a next column in a decoder trellis, such as the Viterbi trellis 22 (e.g., block 128). The decoder circuit 106 may then use the high precision signal HPQS to update a subset of a quantity M selected states of the next column in the decoder trellis (e.g., block 130). A track-back to a depth L may be performed by the decoder circuit 106 to decode an earlier received bit (e.g., block 132). The entire method 120 may be repeated upon a reception of additional set of symbols in the channel signal DIN.

Figure 6:
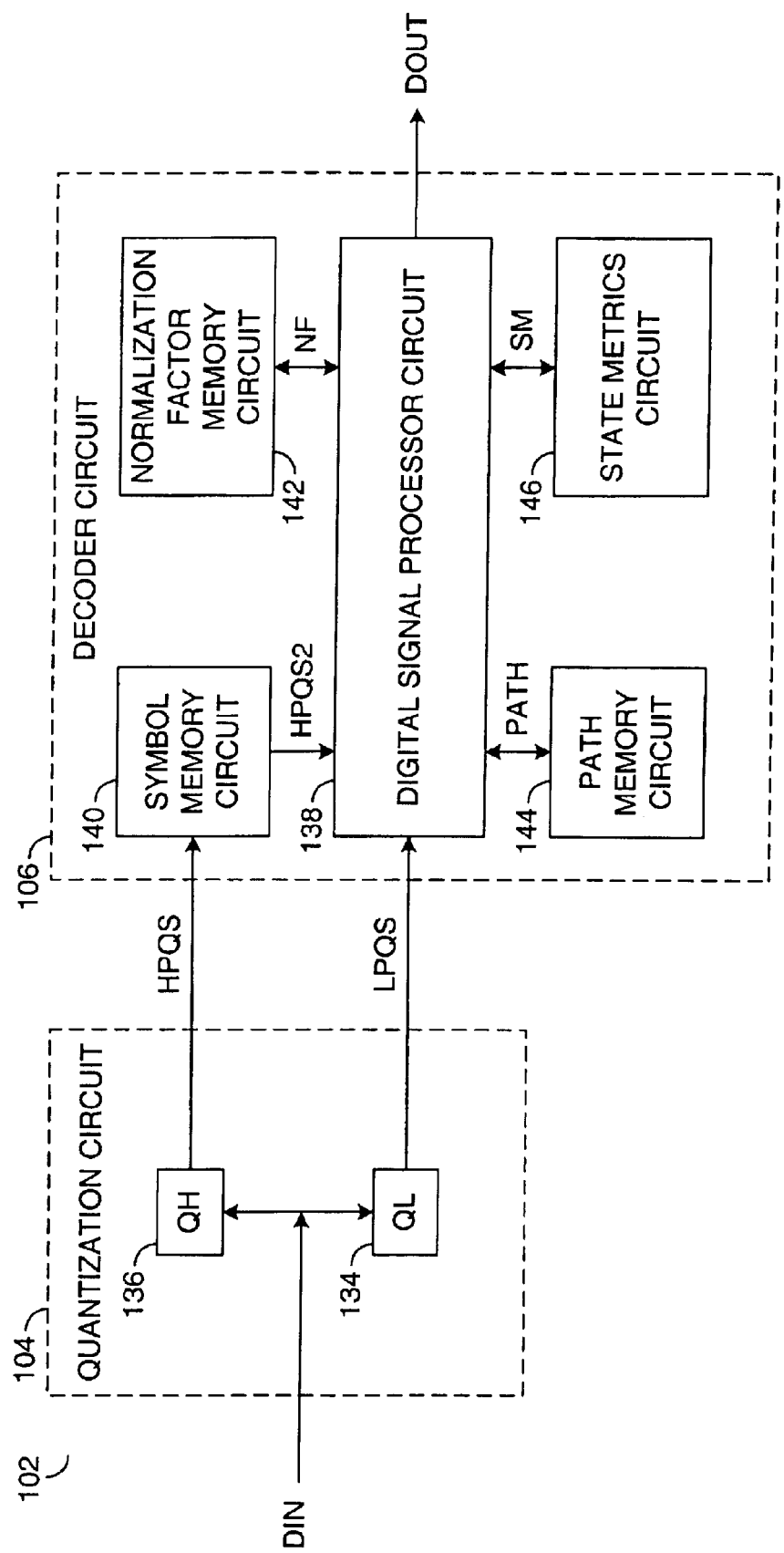
FIG. 6 is a detailed block diagram of FIG. 4.

Referring to FIG. 6, a detailed block diagram of the apparatus 102 is shown. The quantizer circuit 104 generally comprises a first quantizer 134 and a second quantizer 136. The first quantizer 134 may be implemented as a hard decision quantizer or a soft decision quantizer having a low precision of only a few bits. The second quantizer 136 may be implemented as a soft decision quantizer. The second quantizer 136 may be configured to have a higher precision than the first quantizer 134.

The first quantizer 134 may be configured to quantize the symbols received in the channel signal DIN to produce the low precision signal LPQS. The second quantizer 136 may be configured to quantized the symbols received in the channel signal DIN to produce the high precision signal HPQS. Quantization of the symbols to both low and high precision may be performed simultaneously. In one embodiment, the symbols may be quantized to the high precision and then the high precision signal HPQS may be decimated or altered to generate the low precision signal LPQS. Other methods for generating the signals HPQS and LPQS may be implemented to meet the design criteria of a particular application.

The decoder circuit 106 generally comprises a signal processor 138, a memory 140, a memory 142, a memory 144 and a memory 146. The signal processor 138 may be implemented as a digital signal processor. The digital signal processor 138 may receive the low precision signal LPQS from the first quantizer 134.

A signal (e.g., HPQS2) may be received by the digital signal processor 138 from the memory 140. A signal (e.g., NF) may be exchanged between the digital signal processor 138 and the memory 142. The digital signal processor 138 may exchange another signal (e.g., PATH) with the memory 144. A signal (e.g., SM) may be exchanged between the memory 146 and the digital signal processor.

The memory 140 may be implemented as a symbol memory. The symbol memory 140 may be configured to store the quantized symbols within the high precision signal HPQS. The quantized symbols may be arranged within the symbol memory 140 to correspond to respective columns of the decoder trellis. In one embodiment, the symbol memory 140 may be configured to store only the most recently high precision quantized symbols. The symbol memory 140 may present the quantized symbol(s) to the digital signal processor 138 in the signal HPQS2.

The memory 142 may be implemented as a normalization factor memory. The normalization factor memory 142 may receive multiple normalization factor values from the digital signal processor 138 within the signal NF. The normalization factor values may be arranged within the normalization factor memory 142 to correspond to respective columns of the decoder trellis. The normalization memory 142 may return a normalization factor value to the digital signal processor within the signal NF. In one embodiment, the normalization factor memory 142 may be configured to store only a current normalization factor.

The memory 144 may be implemented as a path memory. The path memory may be configured to store predecessor state information for each path through each state in each column of the decoder trellis. The digital signal processor 138 may provide new predecessor state information to the path memory 144 within the signal PATH. The path memory 144 may also provide predecessor state information to the digital signal processor 138 within the signal PATH.

The memory 146 may be implemented as a state metrics memory. The state metrics memory 146 may be configured to store state metric values for each state in each column of the decoder trellis. The state metrics memory 146 is generally designed to be capable of storing all state metrics as high precision state metrics and as low precision state metrics. The signal SM may convey new state metrics information from the digital signal processor 138 to the state metrics memory 146. The signal SM may also convey existing state metrics information from the state metrics memory 146 to the digital signal processor 138. In one embodiment, the state metrics memory 146 may only need to store the state metrics for a current state and a next state of the decoder trellis.

Figure 7:
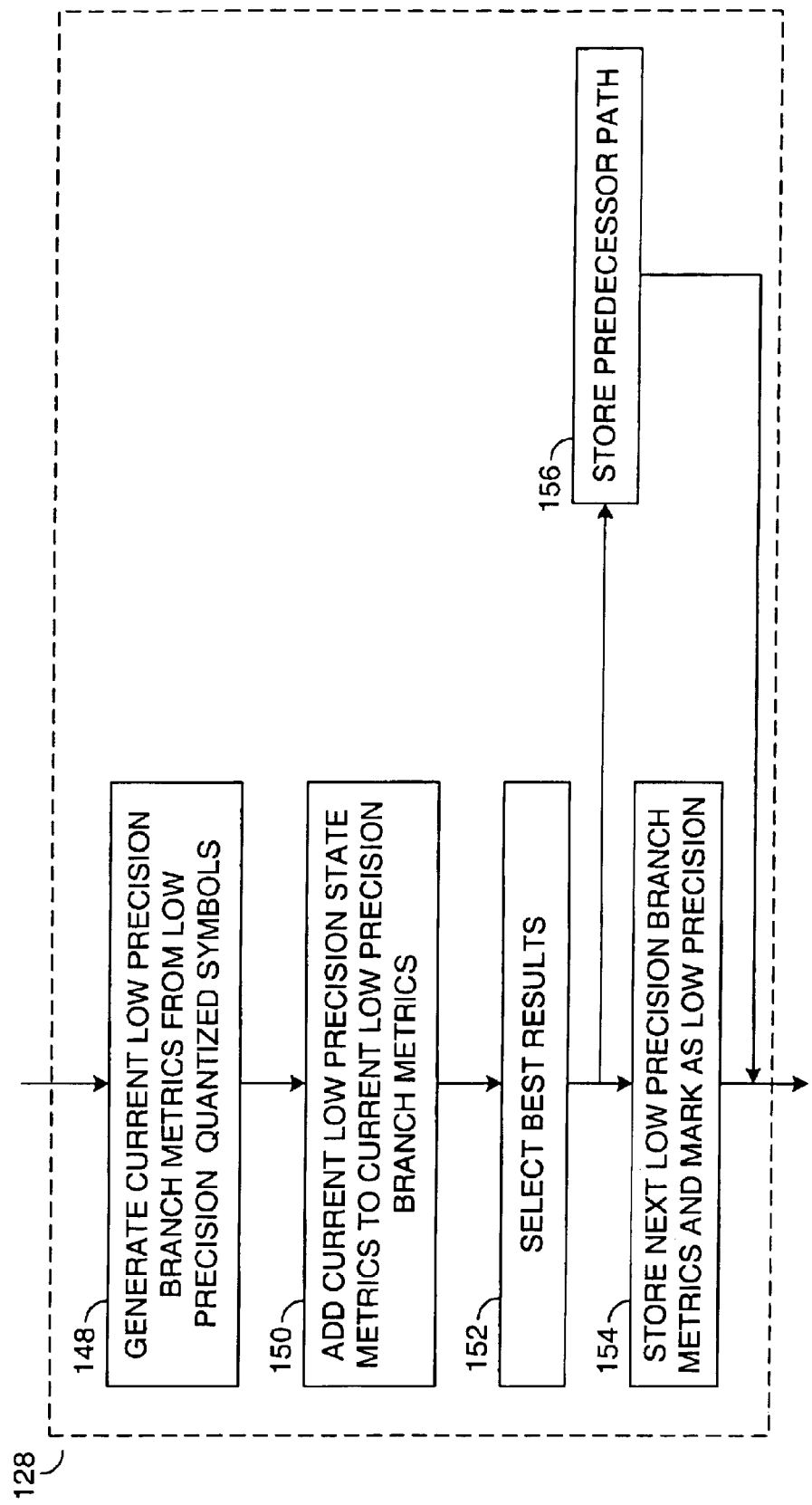
FIG. 7 is a flow diagram of a method for updating a decoder trellis with low precision quantized symbols.

Referring to FIG. 7, a flow diagram of a method for updating the decoder trellis (e.g., block 128 of FIG. 5) with the low precision signal LPQS is shown. Upon receipt of the low precision quantized symbols from the quantizer 134, the digital signal processor 138 may generate a low precision branch metric for each possible branch exiting each current state within the decoder trellis (e.g., block 148). Each low precision branch metric may then be added to the state metric of the exiting state to generate a temporary next state metric (e.g., block 150). For example, if k=1 in the code rate ratio (k/n), then each next state in the decoder trellis may have two entering branches and a selection of the best temporary next state metric may thus be made for each pair of branches (e.g., block 152). The selected temporary next state metrics may then be saved to the state metrics memory 146 and the next state metrics marked as low precision (e.g., block 154). Furthermore, the selected branches may be identified in the predecessor memory 146 (e.g., block 156). In general, the decoder trellis may be updated from the current state metrics in a current column to multiple next state metrics in a next column. All of the next state metrics may have low precision state metric values at block 154 of the method.

Figure 8:
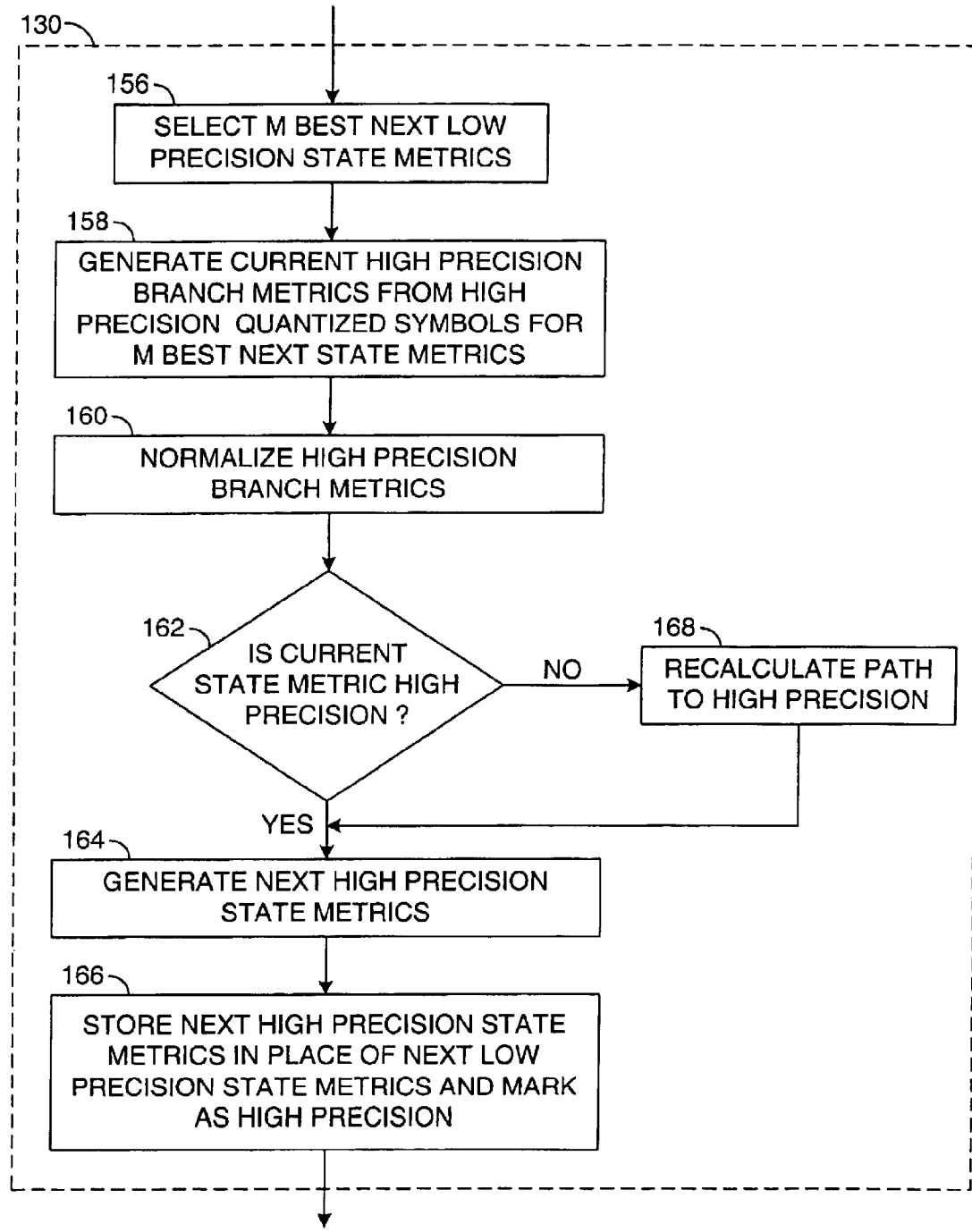
FIG. 8 is a flow diagram of a method for updating the decoder trellis with high precision quantized symbols.

Referring to FIG. 8, a flow diagram of a method for updating the decoder trellis (e.g., block 130 of FIG. 5) with the high precision signals HPQS2 is shown. The digital signal processor 138 may examine each state metric value (accumulated error) for the next state metrics just stored in the state metrics memory 146 in block 154. The digital signal processor 138 may then select a quantity M of the next state metrics having the N lowest state metrics values (e.g., block 156). The digital signal processor 138 may then generate high precision branch metrics between the current state metrics and the next state metrics for each of the M selected branches (e.g., block 158).

During a trace-back, the high precision state with the minimum accumulated error is generally the starting point, therefore, the method may be designed such that no state may be given an unfair advantage over the other states. The higher precision calculation of the high precision branch metrics for the most likely candidate states generally improves a probability of selecting a real best state for the trace-back. However, since the high precision quantization and high precision branch metrics error calculation methods are different from the low precision quantization and low precision branch metrics calculation methods, a correction term may be added to the high precision branch metrics to keep the accumulated error values of the high precision state metrics normalized to the accumulated error values of the low precision state metrics (e.g., block 160). The normalization situation may be defined as follows:

Given:
Set $E_H = \{eh_1, eh_2, \ldots, eh_M\}$ corresponding to the trellis states updated using high resolution quantization (e.g., eh); and
Set $E_L = \{el_1, el_2, \ldots, el_{(2^{K-1}-M)}\}$ corresponding to the trellis states updated using low resolution quantization (e.g., el)

Then:
Calculate a normalization value N such that for a set $E = \{eh_1-N, \ldots, eh_M-N, el_1, \ldots el_{(2^{K-1}-M)}\}$, no state $e_i \in E$ may have an unfair advantage over other states $e_j \in E$ (i≠j).

A check may be made to determine if each high precision branches may be exiting from a high precision state metric (e.g., decision block 162). If the high precision branch originates from a high precision state (e.g., the YES branch of decision block 162), then the next state metrics may be set to a sum of the current high precision state metrics plus the high precision branch metrics (e.g., block 164). The next high precision state metrics may then be stored in the state metrics memory 146 and marked as high precision (e.g., block 166).

For a high precision branch metric exiting from a low precision state (e.g., the NO branch of decision block 162), the low precision state metrics may be recalculated as a high precision state metric prior to proceeding (e.g., block 168).

Once the current state metric has been recalculated as a high precision state metric, then the next state metric may be generated as a sum of the current high precision state metric plus the current high precision branch metrics (e.g., block 164) and stored (e.g., block 166). In one embodiment, the current low precision state metric may be added to the current high precision state metric to produce the next state metric.

One of several methods may be used for normalizing the lower and higher resolution branch metric values obtained during decoding. In general, an efficient approach of finding the correction value may be calculating the difference between the best high resolution and the best low resolution branch metric at each iteration. A further improvement in normalizing may be achieved by averaging the differences of two or more branch metrics.

Figure 9:
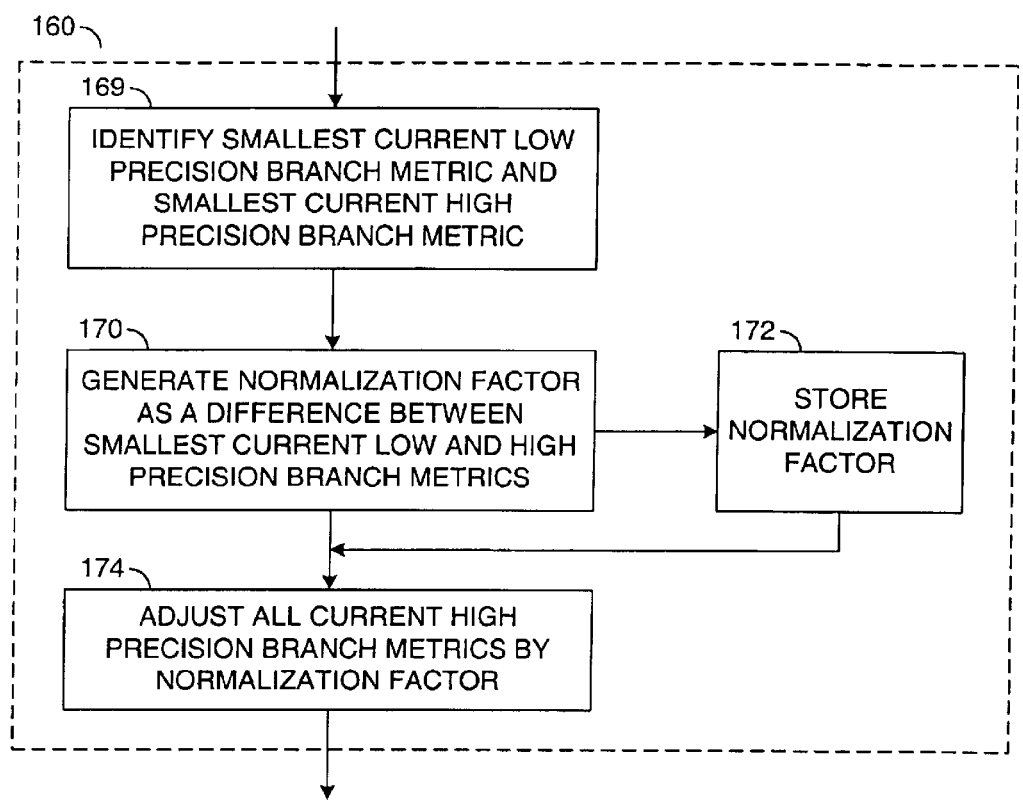
FIG. 9 is a flow diagram of a first method for normalizing.

Referring to FIG. 9, a flow diagram of a first method for normalizing (e.g., block 160 of FIG. 8) is shown. The first normalization method generally involves identifying (i) the current low precision branch metric with the lowest branch metric value among the current low precision branch metrics and (ii) the current high precision branch metrics with the lowest branch metric value among the current high precision branch metrics (e.g., block 169). A difference between the current lowest value low precision branch metrics and the current lowest value high precision branch metrics may then be generated to create a normalization factor for the current column of the decoder trellis (e.g., block 170). The current normalization factor may then be stored in the normalization factor memory 142 for possible later use (e.g., block 172). Finally, all of the current high precision branch metrics may be adjusted by the current normalization factor (e.g., block 174). Afterwards, the current normalized high precision block metrics may be used to generate the next high precision state metrics (e.g., block 164 in FIG. 8).

Figure 10:
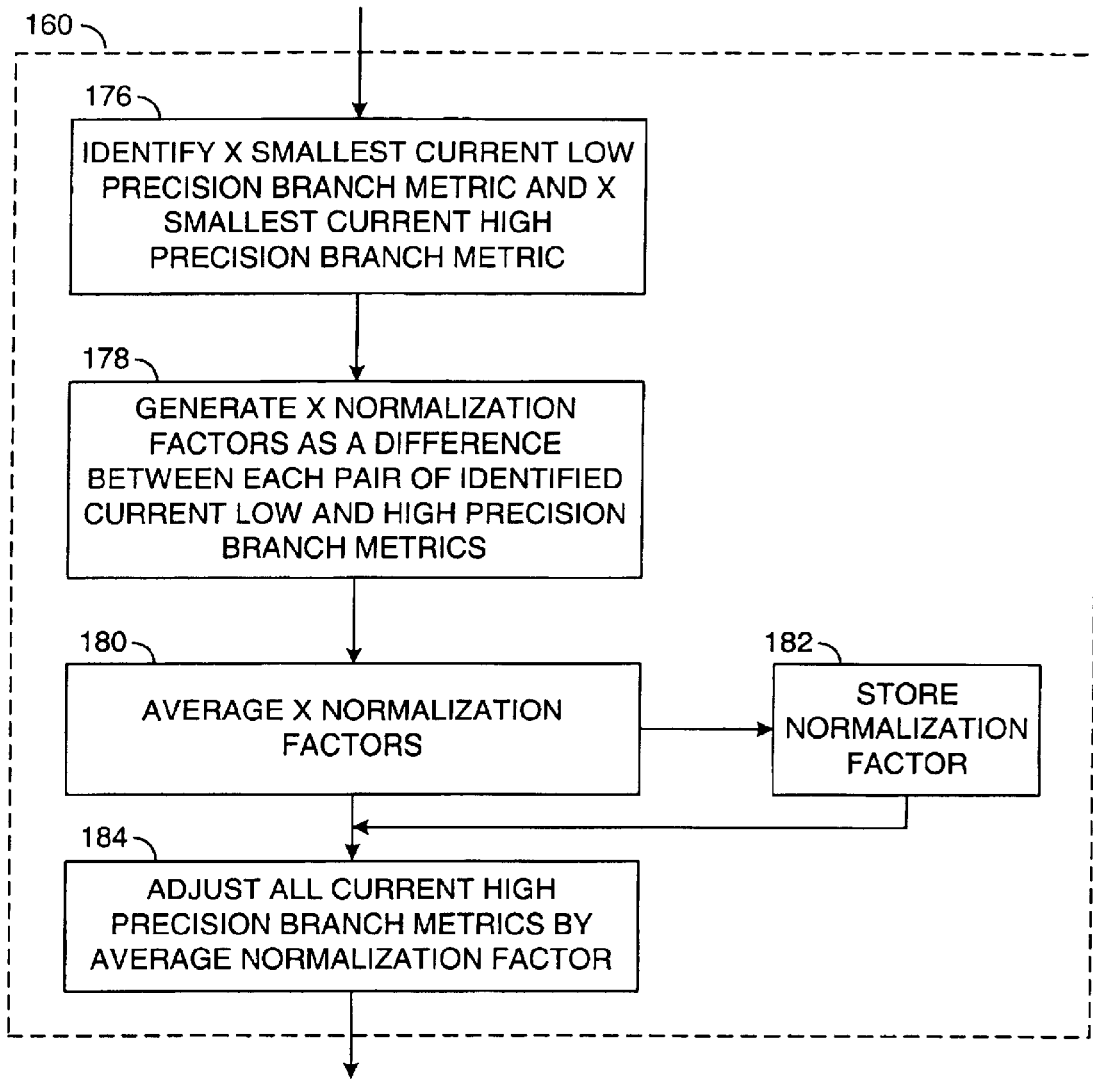
FIG. 10 is a flow diagram of a second method for normalizing.

Referring to FIG. 10, a flow diagram of a second method for normalizing is shown (e.g., the block 160 of FIG. 8). The second normalization method generally involves identifying (i) two or more (e.g., X, X≧2) current low precision branch metrics having the lowest branch metrics values among the current low precision branch metrics and (ii) an equal number of current high precision branch metrics having the lowest branch metric values among the current high precision branch metrics (e.g., block 176). The lowest current low precision branch metric may be paired with lowest current high precision branch metric, the second lowest current low precision branch metric may be paired with the second lowest current high precision branch metric, and so on for all X pairs. Differences may, then be determined for each of the X pairs of current low and high precision branch metrics (e.g., block 178). All of the differences may then be averaged (e.g., block 180) to generate an overall average normalization factor for the current column of the decoder trellis. The average normalization factor may be stored in the normalization factor memory 142 for potential later use (e.g., block 182). All of the current high precision block metrics for the current column of the decoder trellis may then be adjusted by the average normalization factor (e.g., block 184). Afterwards, the current normalized high precision block metrics may be used to generate the next high precision state metrics (e.g., block 164 in FIG. 8).

An example normalization method may be provided by the following sample pseudo-code:

```
Normalize_Trellis_States( ) {
    imin = i where e_i ∈ E_L such that e_i ≦ e_j for all e_j ∈ E_L
    iprev = p where transition e_p->e_imin was recorded in trellis
    BL1 = | Low_Quantized(U1) - S1(e_iprev ,e_imin) |
    BL2 = | Low_Quantized(U2) - S2(e_iprev ,e_imin) |
    N1 = | Lowres_Quantize(U1) - Highres_Quantize(S0) |
    N2 = | Lowres_Quantize(U2) - Highres_Quantize(S1) |
    IF (BL1 =0 AND BL2>0) OR (BL1>0 AND BL2=0)
        N = - (N1 + N2)
    ELSE
        N = N1 + N2
    END IF
    Calculate set E = {eh_1-N, . . . , eh_M-N, el_1, . . . , el(2^(K-1)M)}
    Subtract e_imin from the elements of the set E: E = {e1-e_imin
, . . . , e2^(K-1) -e_imin}
}
```

Where U1 and U2 are current symbols received on the channel (rate ½) and S1($e_i$, $e_j$) and S2($e_i$, $e_j$) are the first and second symbols output by the encoder for transition from state $e_i$ to $e_j$.

In rate ½ decoding, the two channel symbols U1 and U2 may be received per decoded bit. In the pseudo-code normalization listed above, a trellis transition, iprev->imin may be found that results in a best state (e.g., $e_{imin}$). The normalization value N may be calculated as a difference of the high and low resolution branch metrics used in the transition resulting in the best low resolution state $e_{imin}$. Since "difference" generally involves absolute values, a decision may be made whether to add or subtract the normalization factor N from high resolution states. After normalizing all high resolution states (e.g., $E_H$), the value of $e_{imin}$ may be subtracted from all trellis states to offset the effects of the accumulating error values that may grow larger as the method proceeds.

A combination of noise and/or bit sequence may cause a previously low precision (unlikely) path to become one of the M selected most likely paths. In one embodiment, the method may simply continue building a high precision path from the low precision path resulting in a multi-resolution path. In another embodiment, the check of the current state metric through which the low precision path flows may result in updating to a high precision status (e.g., the NO branch of decision block 162 in FIG. 8). Updating the low precision path may involve updating back through the decoder trellis a few columns or updating back to the earliest retained column of state metrics.

Figure 11:
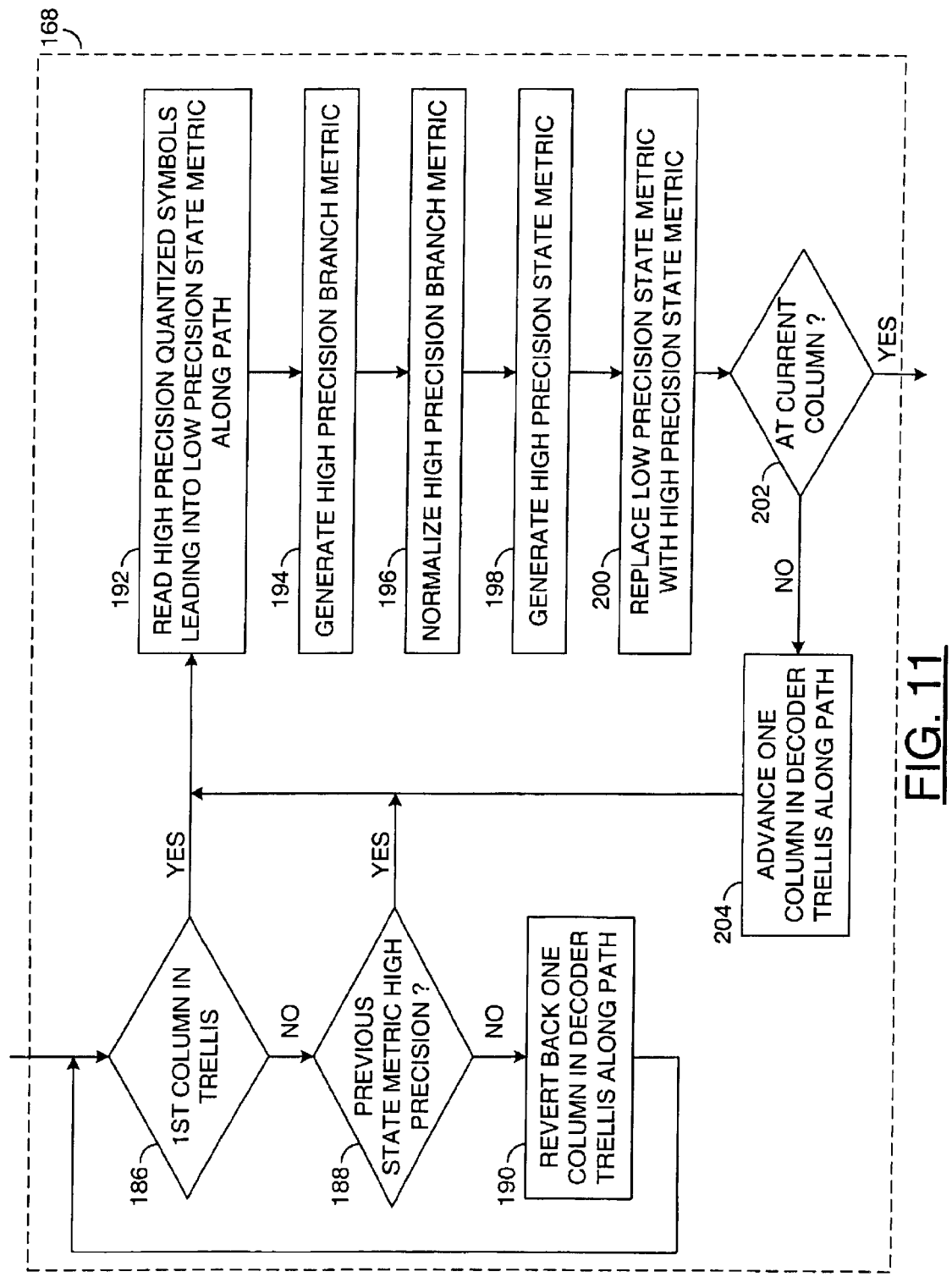
FIG. 11 is a flow diagram of a method for recalculating a low precision path.

Referring to FIG. 11, a flow diagram of a method for recalculating a low precision path (e.g., block 168 of FIG. 8) is shown. The current column of the path is generally checked first to determine if the current column may actually be the first or earliest column in the decoder trellis (e.g., decision block 186). If the current column is the first column (e.g., the YES branch of the decision block 186), then the only low precision path history to recalculate may be the current/first low precision state metric. If the current column is not the first column (e.g., the NO branch of decision block 186), then the precision of the previous state metric in the previous decoder trellis column along the low precision path may be checked (e.g., decision block 188).

If the previous state metric is a high precision type state metric (e.g., the YES branch of the decision block 188), then the recalculation of the low precision path may begin from the previous high precision state metric. If the previous state metric is a low precision type state metric (e.g., the NO branch of the decision block 188), then the low precision path may be followed back one column in the decoder trellis (e.g., block 190). Again, the check may be made to see if the path has been followed back to the first column (e.g., decision block 186). The resulting loop of the decision block 186, the decision block 188, and the revert back block 190 may be iterated until either reaching the first column or the low precision path merges with a high precision path.

From the YES branches of the decision blocks 186 and 188, the method may begin recalculating the low precision path in a forward direction. First, a high precision quantized symbol and a normalization factor for the present column of the decoder trellis may be read from the symbols memory 140 and the normalization factor memory 142, respectively (e.g., block 192). The digital signal processor 138 may then generate a high precision branch metric for the low precision path being recalculated (e.g., block 194). The digital signal processor 138 may normalize the newly calculated high precision branch metric using the same normalization factor used earlier to normalize the other high precision branch metrics in the present column (e.g., block 196).

A summation of the present high precision branch metric and the present high precision state metric generally used determines the next high precision state metric along the path being recalculated (e.g., block 198). The digital signal processor 138 may write the newly generate high precision state metric into the state metrics memory 146 of the appropriate column of the decoder trellis replacing the existing low precision state metric (e.g., block 200). A check may be made to determine if a current end of the path has been reached (e.g., decision block 202). If the newly recalculated high precision state metric is earlier in time than the current state metrics (e.g., the NO branch of the decision block 202), then the recalculation process may advance a column in the decoder trellis (e.g., block 204) and recalculate a subsequent state metric (e.g., starting at the block 192). If the newly recalculated high precision state metric is the current state metric (e.g., the YES branch of the decision block 202), then the recalculation of the low precision path as a high precision path has been completed. Thereafter, the method may continue with generating the next high precision state metrics (e.g., block 164 in FIG. 8).

Experimental simulation results for the multi-resolution decoding method generally show that improvements in performance may be achieved over hard decision decoding by only recalculating a small fraction of the trellis paths. Many parameters can affect the performance of the Viterbi decoder apparatus 102. For example, all parameters that may constitute the degrees of freedom in an eight-dimensional solution space may be provided as shown in Table I as follows:

TABLE I

| K | Constraint Length {3, 4, 5, 6, 7, . . . } |
|---|---|
| L | Trace-back Depth {1*K, 2*K, 3*K, 4*K, 5*K, . . . } |
| G | Encoder Polynomial(s) |
| R1 | Quantization used for high-resolution decoding |
| R2 | Quantization used for low-resolution decoding |
| Q | Quantization method (hard, fixed, adaptive) |
| N | Normalization method |
| M | Number of multi-resolution paths (1, 2, . . . , $2^{K-1}$) |

The parameter K may be the constraint length of the convolutional encoder and L may be the trace-back depth of the decoder apparatus 102. Although K and L do not have any theoretic bounds, current practical values are generally K<10 and L<30*K. Experimentation has shown that in most cases, trellis depths larger than 7*K do not have any significant impact on the bit error rate (BER). Several standard specifications of G generally exist for different values of K. A designer may have the option of selecting multiple variations of G, although in most cases G may be fixed.

The quantization resolution parameters R1 and R2 generally indicate a number of bits used in the calculation of the branch metrics. As discussed earlier, higher number of bits (soft decision) translate to better BER performance. Also, the choice of the values of R1 and R2 affect the multi-resolution normalization methods. Currently, the parameter N may be used to specify the number of branch metric values used in the calculation of the multi-resolution correction factor. For pure hard or soft decoding, the parameter N may be set to zero (e.g., no normalization). The parameter M generally specifies the number of trellis states (paths) that are recalculated using higher resolution in multi-resolution decoding.

Figure 12:
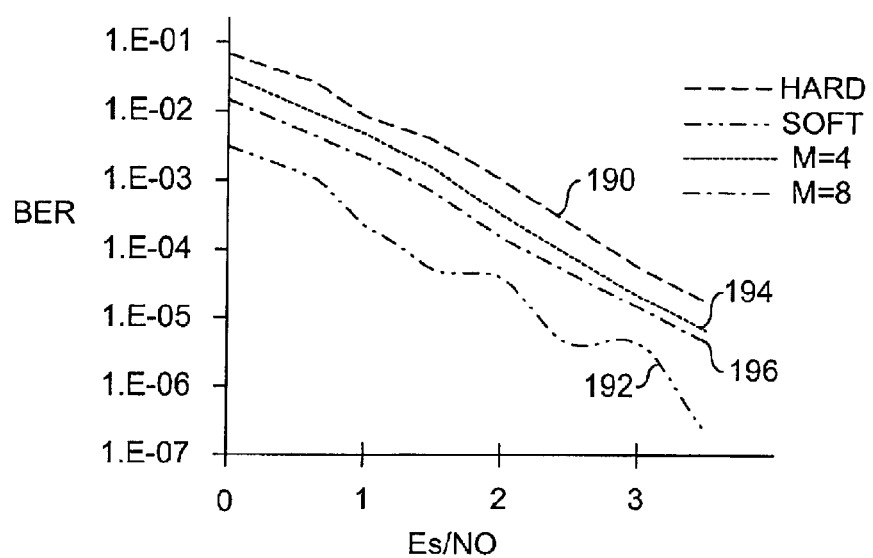
FIG. 12 is a diagram illustrating simulations of BER vs. Es/NO for several decoding methods.

Referring to FIG. 12, a graph of software simulations of BER vs. Es/No is shown for several decoding methods. Two of the software simulations were generally used to measure the performance (in terms of the BER) of each instance of the decoding method 120 under varying signal to noise ratios. Several configuration files and scripts were used to specify the range of parameters used and automate user tasks. The parameter M was set to one and the first normalization method was used.

The graph in FIG. 12 generally shows the relative BER for several Viterbi decoding methods. A pure hard-decision Viterbi decoding method is generally shown by line 190. A pure soft-decision Viterbi decoding method is generally shown by line 192. Two multi-resolution Viterbi decoding methods with K=5 using 1-bit hard-decision low resolution and 3-bit adaptive soft decoding high-resolution as the multi-resolution parameters are generally shown by lines 194 and 196. The line 194 may have the number of selected high resolution paths parameter M=4. The line 196 may have the number of selected high resolution paths parameter M=8. On average, using four high-resolution paths (line 194) generally resulted in a 64% improvement in the BER as compared with the pure hard-decision decoding method illustrated by line 190. Using eight high-resolution paths (line 196) generally resulted in 82% improvement in the BER over the pure hard-decision decoding method illustrated by the line 190.

Application specific integrated circuit devices may be implemented in order to achieve multi-resolution decoding. In particular, programmable architectures generally enable the use of advanced data structures, such as heap, that may reduce a complexity introduced by multi-resolution decoding. Therefore, programming structures may be suitable to take advantage of the benefits of the multi-resolution decoding. Other architectures may be implemented to meet the design criteria of a particular application.

As used herein, the term "simultaneously" is meant to describe events that share some common time period but the term is not meant to be limited to events that begin at the same point in time, end at the same point in time, or have the same duration.

The function performed by the flow diagrams of FIGS. 5 and 7–11 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMS, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. A method for decoding comprising the steps of:
   (A) generating a plurality of first precision state metrics for a decoder trellis in response to a plurality of first precision branch metrics;
   (B) generating a plurality of second precision state metrics for a selected subset of said first precision state metrics in response to a plurality of second precision branch metrics;
   (C) replacing said selected subset of first precision state metrics with said second precision state metrics; and
   (D) storing said first precision state metrics and said second precision state metrics.

2. The method according to claim 1, further comprising the steps of:
   generating said first precision branch metrics in response to a plurality of first precision symbols; and
   generating said second precision branch metrics in response to a plurality of second precision symbols.

3. The method according to claim 2, further comprising the steps of:
   generating said first precision symbols in response to first precision quantizing a plurality of received symbols; and
   generating said second precision symbols in response to second precision quantizing said received symbols.

4. The method according to claim 3, further comprising the step of storing said second precision symbols for each of a number of columns of said decoder trellis.

5. The method according to claim 1, further comprising the step of normalizing said second precision branch metrics prior to generating said second precision state metrics in response to a normalization factor.

6. The method according to claim 5, further comprising the step of storing said normalization factor for each of a number of columns of said decoder trellis.

7. The method according to claim 5, wherein the step of normalizing comprises the sub-steps of:
   generating a difference between a smallest first precision branch metric of said first precision branch metrics and a smallest second precision branch metric of said second precision branch metrics; and
   adjusting said second precision branch metrics by said difference.

8. The method according to claim 5, wherein the step of normalizing comprises the sub-steps of:
   generating a plurality of differences between a first subset of said first precision branch metrics and a second subset of said second precision branch metrics;
   generating an average difference from said differences; and
   adjusting said second precision branch metrics by said average difference.

9. The method according to claim 1, further comprising the steps of:
   determining a path from one of said second precision state metrics back to an earlier first precision state metric;
   generating an earlier second precision branch metric leading into said earlier first precision branch metric;
   generating an earlier second precision state metric in response to said earlier second precision branch metric; and
   replacing said earlier first precision branch metric with said earlier second precision state metric.

10. The method according to claim 9, further comprising the steps of:
    generating a subsequent second precision branch metric from said earlier second precision state metric to a subsequent first precision state metric along said path;
    generating a subsequent second precision state metric in response to said subsequent second precision branch metric; and
    replacing said subsequent first precision state metric with said subsequent second precision state metric.

11. An apparatus comprising:
    a processor circuit configured to (i) generate a plurality of first precision state metrics for a decoder trellis in response to a plurality of first precision branch metrics, (ii) generate a plurality of second precision state metrics for a selected subset of said first precision state metrics in response to a plurality of second precision branch metrics, and (iii) replace said selected subset of first precision state metrics with said second precision state metrics; and
    a state metrics memory configured to store said first precision state metrics and said second precision state metrics.

12. The apparatus according to claim 11, wherein said processor circuit is further configured to:
    generate said first precision branch metrics in response to a plurality of first precision symbols; and
    generate said second precision branch metrics in response to a plurality of second precision symbols.

13. The apparatus according to claim 12, further comprising a quantizer circuit configured to (i) generate said first precision symbols in response to first precision quantizing a plurality of received symbols and (ii) generate said second precision symbols in response to second precision quantizing said received symbols.

14. The apparatus according to claim 13, further comprising a symbol memory configured to store said second precision symbols for each of a number of columns of said decoder trellis.

15. The apparatus according to claim 11, wherein said processor circuit is further configured to normalize said second precision branch metrics prior to generating said second precision state metrics in response to a normalization factor.

16. The apparatus according to claim 15, further comprising a normalization memory configured to store said normalization factor for each of a number of columns of said decoder trellis.

17. The apparatus according to claim 15, wherein normalizing comprises:

generating a difference between a smallest first precision branch metric of said first precision branch metrics and a smallest second precision branch metric of said second precision branch metrics; and adjusting said second precision branch metrics by said difference.

18. The apparatus according to claim 15, wherein normalizing comprises:

generating a plurality of differences between a first subset of said first precision branch metrics and a second subset of said second precision branch metrics;

generating an average difference from said differences; and adjusting said second precision branch metrics by said average difference.

19. The apparatus according to claim 11, further comprising a path memory configured to determine a path from one of said second precision state metrics back to an earlier first precision state metric, wherein said processor circuit is further configured to:

generate an earlier second precision branch metric leading into said earlier first precision branch metric;

generate an earlier second precision state metric in response to said earlier second precision branch metric; and replace said earlier first precision branch metric with said earlier second precision state metric in said state metrics memory.

20. An apparatus comprising:

means for generating a plurality of first precision state metrics for a decoder trellis in response to a plurality of first precision branch metrics;

means for generating a plurality of second precision state metrics for a selected subset of said first precision state metrics in response to a plurality of second precision branch metrics;

means for replacing said selected subset of first precision state metrics with said second precision state metrics; and means for storing said first precision state metrics and said second precision state metrics.

* * * * *